United States Patent
Ishikawa (10) Patent No.: US 10,038,423 B2
(45) Date of Patent: Jul. 31, 2018

(54) NOTCH FILTER

(71) Applicant: NIHON DEMPA KOGYO CO., LTD., Tokyo (JP)

(72) Inventor: Takahiro Ishikawa, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 16 days.

(21) Appl. No.: 15/451,413

(22) Filed: Mar. 7, 2017

(65) Prior Publication Data
US 2017/0264270 A1 Sep. 14, 2017

(30) Foreign Application Priority Data

Mar. 8, 2016 (JP) ................................. 2016-044056

(51) Int. Cl.
*H03H 9/64* (2006.01)
(52) U.S. Cl.
CPC ................. *H03H 9/6409* (2013.01)
(58) Field of Classification Search
CPC ........................................................ H03H 9/64
USPC ........................................ 333/133, 193, 195
See application file for complete search history.

(56) References Cited

U.S. PATENT DOCUMENTS

| | | | |
|---|---|---|---|
| 7,034,638 B2 * | 4/2006 | Yamamoto | H03H 9/6483 310/313 R |
| 7,619,494 B2 * | 11/2009 | Suzuki | H03H 9/568 333/133 |
| 7,864,002 B2 * | 1/2011 | Wada | H03H 9/6483 333/189 |
| 8,306,499 B2 * | 11/2012 | Yamakawa | H03H 7/0153 455/307 |
| 8,525,620 B2 * | 9/2013 | Stuebing | H03H 9/605 333/133 |
| 2014/0113580 A1 * | 4/2014 | Yamazaki | H03H 9/6483 455/307 |
| 2016/0294423 A1 * | 10/2016 | Yatsenko | H04B 1/1036 |

FOREIGN PATENT DOCUMENTS

| | | |
|---|---|---|
| JP | H1065490 | 3/1998 |
| JP | 2012257050 | 12/2012 |
| JP | 5294868 | 9/2013 |

* cited by examiner

*Primary Examiner* — Dean Takaoka
(74) *Attorney, Agent, or Firm* — JCIPRNET (57) ABSTRACT

A high-pass notch filter includes an input port, an output port, a third SAW resonator, a first inductor element, and a second inductor element. The first SAW resonator is configured to resonate in parallel at a first frequency corresponding to the attenuation band. The second SAW resonator is configured to resonate in parallel at a second frequency corresponding to the attenuation band. The third SAW resonator is configured to resonate in parallel at a third frequency corresponding to the attenuation band. The first inductor element has one end and another end. The one end is connected between the first SAW resonator and the third SAW resonator, and the other end is grounded. The second inductor element has one end and another end. The one end is connected between the second SAW resonator and the third SAW resonator, and the other end is grounded.

4 Claims, 7 Drawing Sheets

NOTCH FILTER

CROSS-REFERENCE TO RELATED APPLICATIONS

This application is based on and claims priority under 35 U.S.C. § 119 to Japanese Patent Application No. 2016-044056, filed on Mar. 8, 2016, the entire content of which is incorporated herein by reference.

TECHNICAL FIELD

This disclosure relates to a high-pass notch filter, particularly relates to a notch filter that enables widening of an attenuation band while holding a sufficient attenuation amount and also reduces an increase of a component count and deterioration of an insertion loss.

DESCRIPTION OF THE RELATED ART

As a filter that employs a Surface Acoustic Wave (SAW), there is a high-pass notch filter that has an attenuation band in a certain frequency band and a pass band on a high frequency side with respect to the attenuation band.

Figure 4:
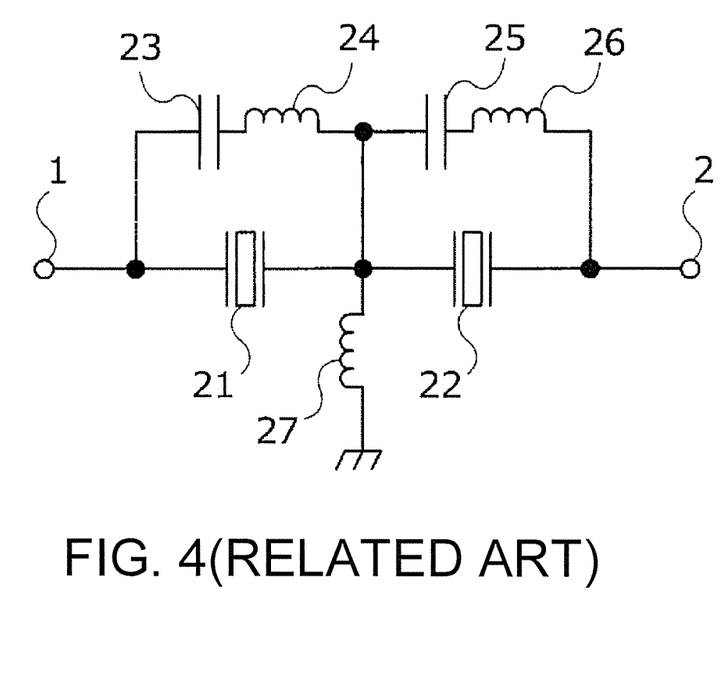
FIG. 4 is a circuit diagram illustrating a conventional notch filter (two-stage)

[Configuration of Conventional Notch Filter (two-stage): FIG. 4]

A conventional high-pass notch filter will be described by referring to FIG. 4. FIG. 4 is a circuit diagram illustrating a configuration of a conventional notch filter (two-stage).

As illustrated in FIG. 4, the conventional notch filter is a two-staged high-pass notch filter (two-stage notch filter) where a SAW resonator 21 and a SAW resonator 22 are connected in series between an input port 1 and an output port 2.

The SAW resonator 21 and SAW resonator 22 resonate in parallel at each specific frequency corresponding to an attenuation band, respectively.

Then, a series circuit constituted of a capacitance element 23 and an auxiliary inductor element 24 is connected in parallel to the SAW resonator 21, and a series circuit constituted of a capacitance element 25 and an auxiliary inductor element 26 is connected in parallel to the SAW resonator 22.

Further, an auxiliary inductor element 27 is arranged with one end connected to a point between the SAW resonator 21 and SAW resonator 22 and the other end grounded.

Figure 5:
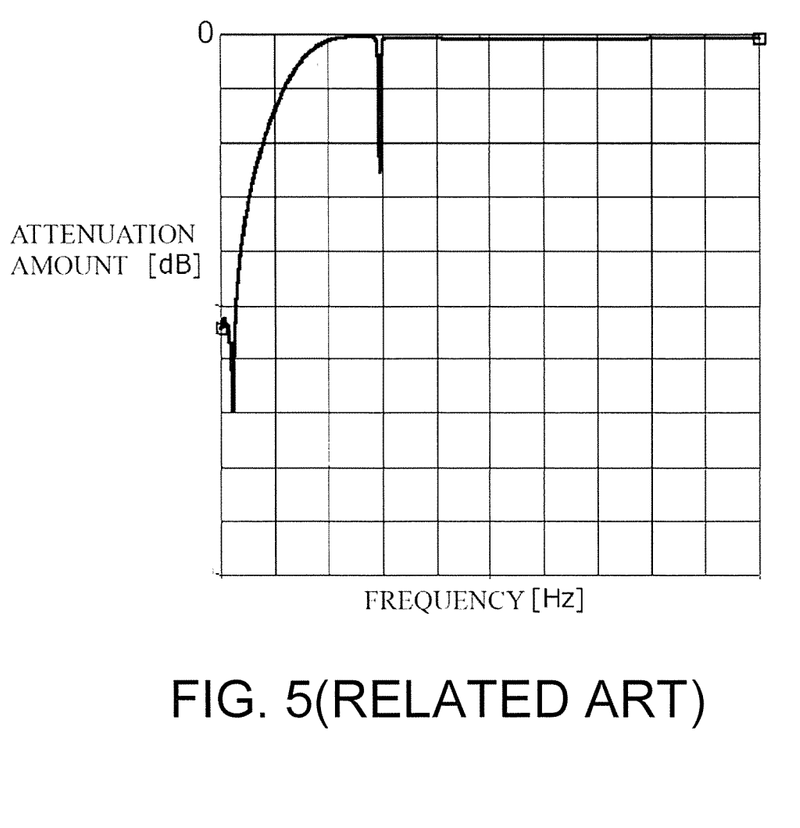
FIG. 5 is a characteristic diagram illustrating an attenuation characteristic of the two-stage notch filter illustrated in FIG. 4.
Figure 6:
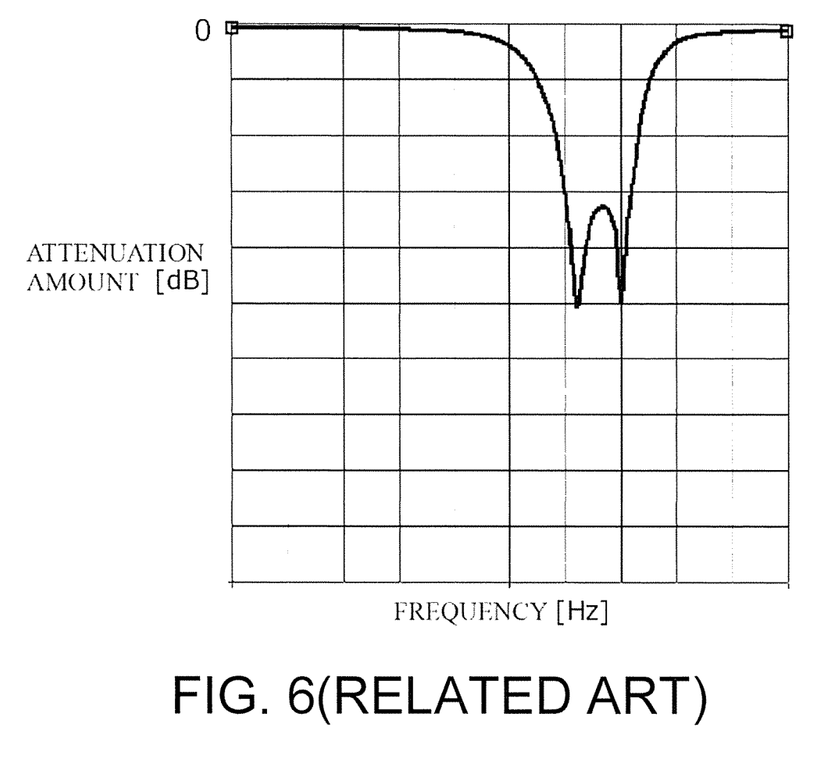
FIG. 6 is an enlarged figure near the attenuation band in FIG. 5.

[Characteristic of Conventional Notch Filter (two-stage): FIG. 5, FIG. 6]

Characteristic of a conventional notch filter will be described by referring to FIG. 5 and FIG. 6. FIG. 5 is a characteristic diagram illustrating an attenuation characteristic of the conventional two-stage notch filter illustrated in FIG. 4. FIG. 6 is an enlarged figure near the attenuation band in FIG. 5.

As illustrated in FIG. 5 and FIG. 6, the attenuation characteristic of the conventional notch filter includes an attenuation band containing anti-resonance points of the two SAW resonators 21 and 22 and has a shape where the characteristic of the respective SAW resonators overlaps.

Then, the characteristic of the conventional notch filter is preferable because of a low insertion loss in the pass band on the high-frequency-band side with respect to the attenuation band.

However, attempting to acquire a wide attenuation band by the two-stage notch filter as described above decreases the overlap of the characteristics of the two SAW resonators and results in deterioration of the attenuation amount.

Figure 7:
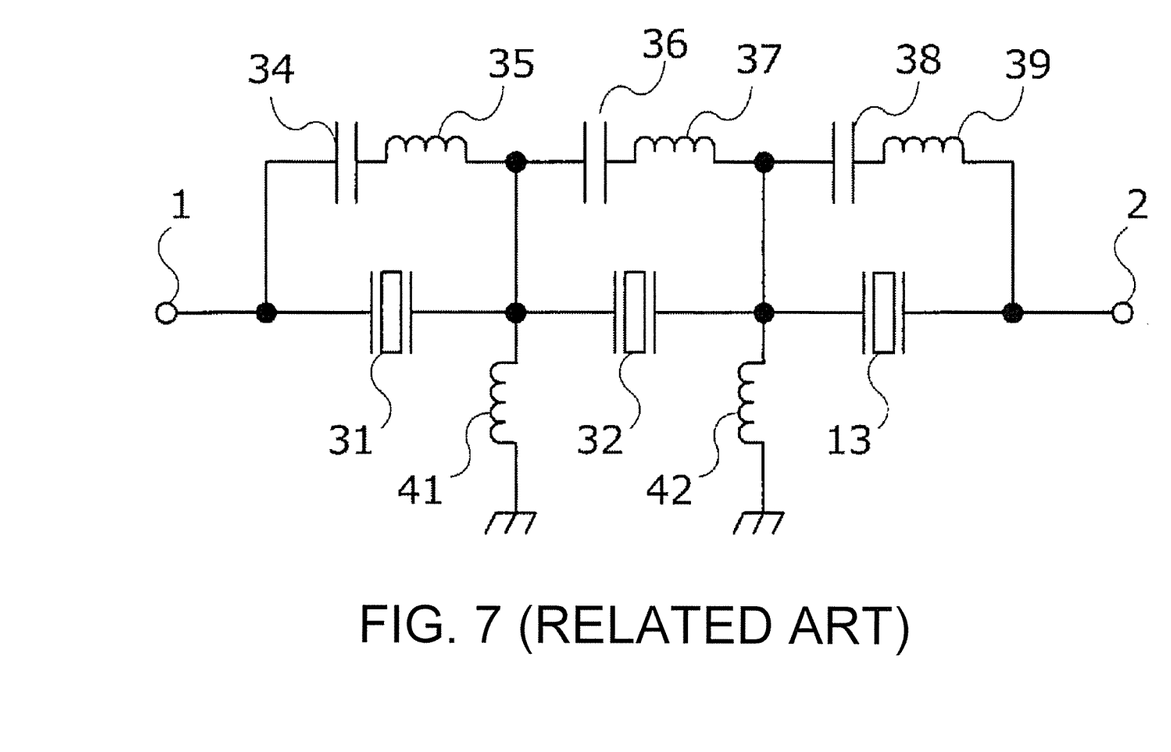
FIG. 7 is a circuit diagram illustrating a configuration of the other conventional notch filter.

[Other Configuration of Conventional Notch Filter (three-stage): FIG. 7]

As a configuration to acquire wider attenuation band, there are other conventional high-pass notch filters. A configuration of the other conventional notch filter will be described by referring to FIG. 7. FIG. 7 is a circuit diagram illustrating the configuration of the other conventional notch filter.

As illustrated in FIG. 7, the other conventional notch filter is configured to have a three-staged SAW resonator (three-stage notch filter).

Specifically, as illustrated in FIG. 7, SAW resonators 31, 32, and 33 are connected in series between an input port 1 and an output port 2.

Then, a series circuit constituted of a capacitance element 34 and an auxiliary inductor element 35 is connected in parallel to the SAW resonator 31, a series circuit constituted of a capacitance element 36 and an auxiliary inductor element 37 is connected in parallel to the SAW resonator 32, and a series circuit constituted of a capacitance element 38 and an auxiliary inductor element 39 is connected in parallel to the SAW resonator 33.

Further, the other conventional notch filter include an inductor element 41 with one end connected to a point between the SAW resonator 31 and the SAW resonator 32 and the other end grounded, and an inductor element 42 with one end connected between the SAW resonator 32 and the SAW resonator 33 and the other end grounded.

Thus, configuring the three-staged SAW resonator overlaps the attenuation characteristics of the three SAW resonators to acquire a wide attenuation band.

However, the three-stage notch filter has increased a component count such as an inductor element compared with the two-stage notch filter and has interfered with reduction in size.

The three-stage notch filter has deteriorated in the insertion loss in the pass band on the high frequency side in the attenuation band.

[Related Technique]

As the related art regarding a filter employing a SAW resonator, Japanese Unexamined Patent Application Publication No. 10-65490 discloses "SAW band-stop filter and electronic equipment that employs the same" (Matsushita Electric Industrial Co., Ltd., Patent Literature 1), Japanese Unexamined Patent Application Publication No. 2012-257050 discloses "high-pass notch filter and electronic equipment that includes the same" (NIHON DEMPA KOGYO CO., LTD., Patent Literature 2), and Japanese Patent No. 5294868 discloses "SAW filter that executes band-stop in wide band" (Epcos Aktiengesellschaft, Patent Literature 3).

Patent Literature 1 discloses a SAW band-stop filter that includes the following: a first SAW resonator connected in series between an input terminal and an output terminal; and a parallel circuit constituted of a second SAW resonator and a first inductor element, which are connected between the input terminal side or the output terminal side and an earth electrode.

Patent Literature 2 discloses a high-pass notch filter that arranges two SAW resonators in series between an input port and an output port, connects an inductor element in parallel between these SAW resonators, and connects a series circuit constituted of a capacitance element and an auxiliary inductor element in parallel with respect to each SAW resonator.

Patent Literature 3 discloses a band-stop filter. The band-stop filter has a ladder type structure that arranges at least one series resonator in a series branch between an input terminal and an output terminal and arranges at least one parallel impedance element in a parallel branch connected in parallel to the series resonator. Here, an average finger period in an interdigital transducer of the at least one series resonator is greater than an average finger period in an interdigital transducer of the parallel impedance element.

However, the conventional two-stage notch filter has a problem that attempting to widen the attenuation band deteriorates the attenuation amount.

The conventional three-stage notch filter has a problem that increase of the component count interferes with reduction in size, and the insertion loss in the pass band on the high frequency side deteriorates.

Patent Literatures 1, 2, and 3 have not disclosed the following: a third SAW resonator is arranged in parallel between the first SAW resonator and the second SAW resonator that are connected in series between the input port and the output port; and further, an inductor element is arranged in parallel to the third SAW resonator in between the first SAW resonator and the third SAW resonator, and in between the third SAW resonator and the second SAW resonator, respectively.

A need thus exists for a notch filter which is not susceptible to the drawback mentioned above.

SUMMARY

According to an aspect of this disclosure, there is provided a high-pass notch filter having a pass band on a high frequency side with respect to an attenuation band. The high-pass notch filter includes an input port, an output port, a third SAW resonator, a first inductor element, and a second inductor element. The input port is configured to receive an input signal. The output port is configured to output an output signal. The first SAW resonator and a second SAW resonator are arranged between the input port and the output port. The first SAW resonator is configured to resonate in parallel at a first frequency corresponding to the attenuation band. The second SAW resonator is configured to resonate in parallel at a second frequency corresponding to the attenuation band. The third SAW resonator has one end and another end. The one end of the third SAW resonator is connected between the first SAW resonator and the second SAW resonator, and the another end of the third SAW resonator is grounded. The third SAW resonator is configured to resonate in parallel at a third frequency corresponding to the attenuation band. The first inductor element has one end and another end. The one end of the first inductor element is connected between the first SAW resonator and the third SAW resonator, and the another end of the first inductor element is grounded. The second inductor element has one end and another end. The one end of the second inductor element is connected between the second SAW resonator and the third SAW resonator, and the another end of the second inductor element is grounded.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

A description will be given of embodiments disclosed here by referring to the attached drawings.

[Outline of Embodiment]

A notch filter according to the embodiment disclosed here is configured as follows: a first SAW resonator and a second SAW resonator are arranged in series between an input port and an output port; a series circuit constituted of a capacitance element and an auxiliary inductor element is connected in parallel to each SAW resonator; a third SAW resonator is connected in parallel to the first and second SAW resonators between the first and second SAW resonators; a first inductor element is connected in parallel to the third SAW resonator between the first SAW resonator and the third SAW resonator; and a second inductor element is connected in parallel to the third SAW resonator between the third SAW resonator and the second SAW resonator. This ensures a wider attenuation band while holding a sufficient attenuation amount, reduction in size by reduction of increase of a component count, and reduction of deterioration of an insertion loss on a high frequency side.

Figure 1:
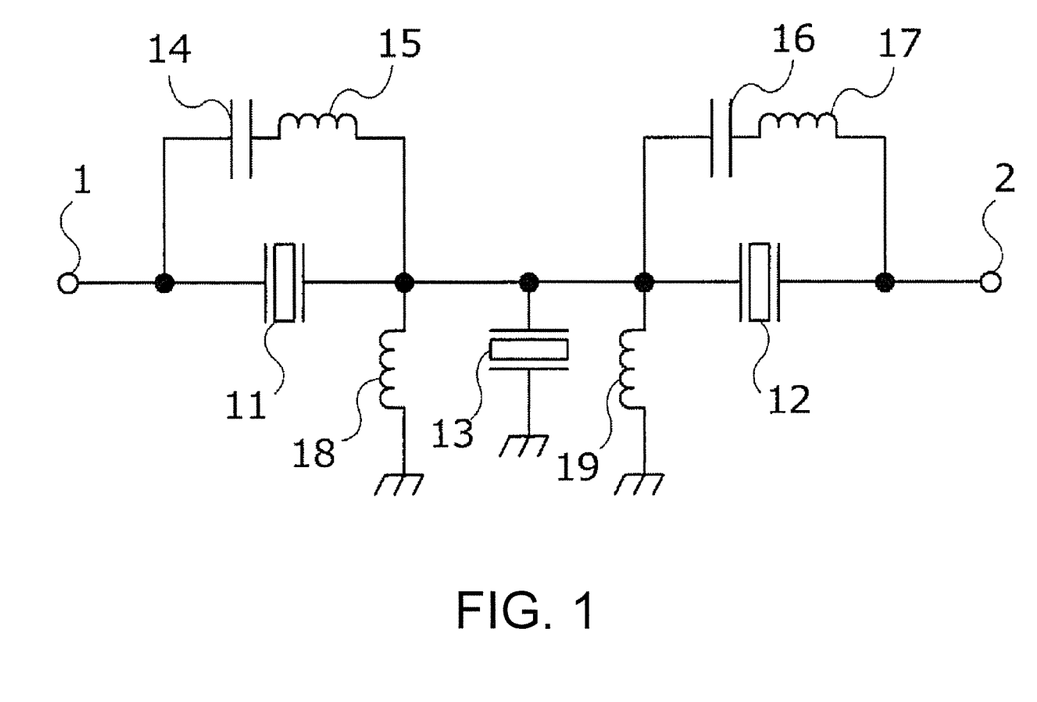
FIG. 1 is a circuit diagram of a notch filter according to an embodiment disclosed here.

[Configuration of Notch Filter according to Embodiment]

The notch filter according to the embodiment disclosed here will be described by referring to FIG. 1. FIG. 1 is the circuit diagram of the notch filter according to the embodiment disclosed here.

As illustrated in FIG. 1, the notch filter (this notch filter) according to the embodiment disclosed here is a two-stage notch filter where a first SAW resonator 11 and a second SAW resonator 12 are connected in series between an input port 1 and an output port 2.

The first SAW resonator 11 and the second SAW resonator 12 resonate in parallel at a frequency corresponding to an attenuation band and anti-resonance frequencies are different with one another. Here, assume that the first SAW resonator 11 has an anti-resonance frequency f1, and the second SAW resonator 12 has an anti-resonance frequency f2 (f1<f2).

Then, a series circuit constituted of a capacitance element 14 and an auxiliary inductor element 15 is connected in parallel to the first SAW resonator 11, and a series circuit constituted of a capacitance element 16 and an auxiliary inductor element 17 is connected in parallel to the second SAW resonator 12.

The capacitance elements 14 and 16 correspond to the first capacitance element and the second capacitance element disclosed in the claim, and the auxiliary inductor elements 15 and 17 correspond to the first auxiliary inductor element and the second auxiliary inductor element.

Then, as a characterizing portion of the notch filter, a third SAW resonator 13 is arranged with one end connected to a point between the first SAW resonator 11 and the second SAW resonator 12 and the other end grounded.

The third SAW resonator 13 also resonates in parallel at a frequency corresponding to the attenuation band; however, assume that the third SAW resonator 13 has an anti-resonance frequency f3 that is different from f1 of the first SAW resonator 11 and f2 of the second SAW resonator 12.

Setting of the anti-resonance frequency f3 of the third SAW resonator 13 will be described later.

Further, the notch filter includes a first inductor element 18 and a second inductor element 19. The first inductor element 18 is arranged with one end connected between the first SAW resonator 11 and the third SAW resonator 13 and the other end grounded. The second inductor element 19 is arranged with one end connected between the third SAW resonator 13 and the second SAW resonator 12 and the other end grounded.

Such a configuration enables the notch filter to acquire a wider attenuation band compared with a conventional two-stage notch filter.

Further, because of the reduction of the component count compared with the conventional three-stage notch filter, the notch filter ensures reduction in size.

Figure 2:
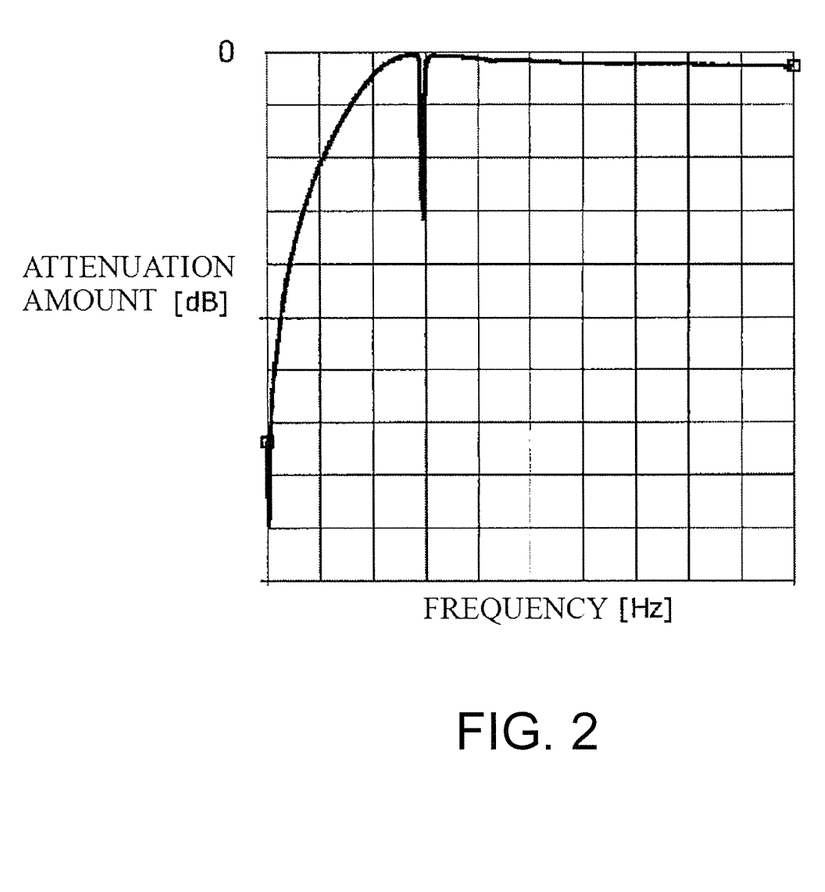
FIG. 2 is a characteristic diagram illustrating an attenuation characteristic of the notch filter.
Figure 3:
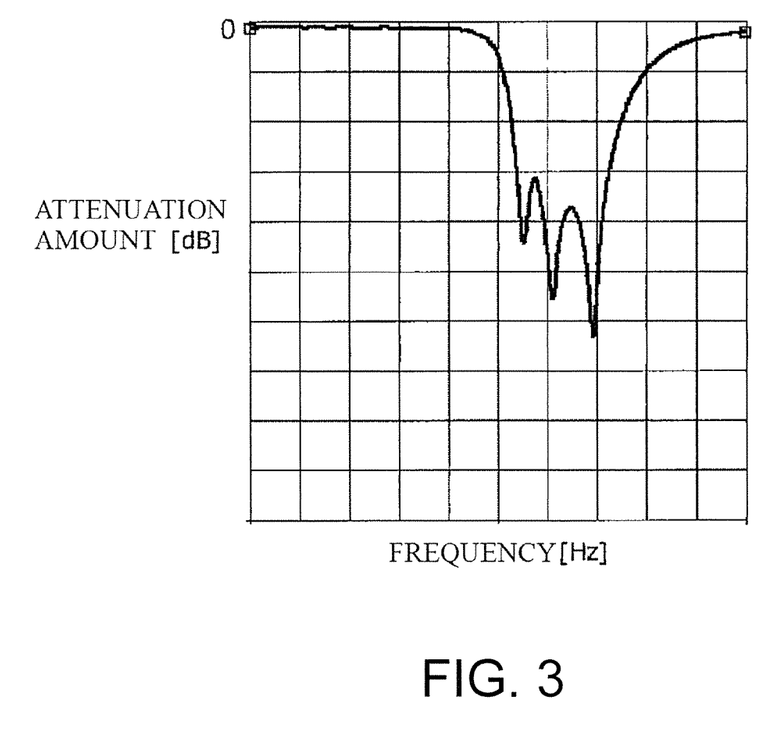
FIG. 3 is an enlarged figure near the attenuation band in FIG. 2.

[Characteristic of Notch Filter: FIG. 2 and FIG. 3]

Next, the characteristic of the notch filter will be described by referring to FIG. 2 and FIG. 3. FIG. 2 is a characteristic diagram illustrating the attenuation characteristic of the notch filter, and FIG. 3 is an enlarged figure near the attenuation band in FIG. 2.

As illustrated in FIG. 2 and FIG. 3, the attenuation characteristic of the notch filter indicates the attenuation band including three anti-resonance points of the first SAW resonator 11, the second SAW resonator 12, and the third SAW resonator 13

Then, the notch filter acquires an equivalent attenuation amount in a wide attenuation band even when compared with the attenuation characteristic of the conventional two-stage notch filter illustrated in FIG. 6.

As illustrated in FIG. 2 and FIG. 3, although slight deterioration of the insertion loss is recognized near the boundary (the high frequency side) between the pass band on the high frequency side in the attenuation band and the attenuation band, the characteristic is improved compared with the conventional three-stage notch filter.

[Setting of Anti-Resonance Frequency of Third SAW Resonator 13: FIG. 3]

Next, the setting of the anti-resonance frequency f3 of the third SAW resonator 13 will be described by referring to FIG. 3.

The anti-resonance frequency of the third SAW resonator 13 may be set outside the attenuation band achieved by the first SAW resonator 11 and the second SAW resonator 12, or may be set inside the attenuation band achieved by the first SAW resonator 11 and the second SAW resonator 12.

When setting the anti-resonance frequency f3 of the third SAW resonator 13 outside the attenuation band achieved by the first SAW resonator 11 and the second SAW resonator 12, to widen the attenuation band toward the low frequency side, the anti-resonance frequency f3 of the third SAW resonator 13 is set on the low frequency side with respect to the anti-resonance frequency f1 of the first SAW resonator 11 (f3<f1).

To widen the attenuation band toward the high frequency side, the anti-resonance frequency f3 of the third SAW resonator 13 is set on the high frequency side with respect to the anti-resonance frequency f2 of the second SAW resonator 12 (f3>f2).

That is, the anti-resonance frequencies are set to be in order of f1, f2, and f3 or in order of f3, f1, and f2 from the low frequency side, in. FIG. 3.

This ensures acquiring wider attenuation band compared with the two-stage notch filter achieved by the first SAW resonator 11 and the second SAW resonator 12.

When setting the anti-resonance frequency f3 of the third SAW resonator 13 inside the attenuation band achieved by the first SAW resonator 11 and the second SAW resonator 12, to widen the attenuation band, the anti-resonance frequency f1 of the first SAW resonator 11 is set on the low frequency side with respect to a conventional manner, the anti-resonance frequency f2 of the second SAW resonator 12 is set on the high frequency side with respect to a conventional manner, and the anti-resonance frequency f3 of the third SAW resonator 13 is set between f1 and f2 (f1<f3<f2).

In FIG. 3, the anti-resonance frequencies are set to be in order of f1, f3, and f2 from the low frequency side.

This ensures acquiring a wider attenuation band than the conventional two-stage notch filter.

Here, the description has been given assuming that the anti-resonance frequency of the first SAW resonator 11 is f1, and the anti-resonance frequency of the second SAW resonator 12 is f2; however, the anti-resonance frequency of the second SAW resonator 12 may be f1, and the anti-resonance frequency of the first SAW resonator 11 may be f2.

[Effect of Embodiment]

The notch filter according to the embodiment disclosed here is configured as follows: the first SAW resonator 11 resonating in parallel at the first frequency corresponding to the attenuation band and the second SAW resonator 12 resonating in parallel at the second frequency corresponding to the attenuation band are arranged in series, between the input port 1 and the output port 2; the third SAW resonator 13 is arranged with one end connected between the first SAW resonator 11 and the second SAW resonator 12 and the other end grounded; the first inductor element 18 is arranged with one end connected between the first SAW resonator 11 and the third SAW resonator 13 and the other end grounded; and the second inductor element 19 is arranged with one end connected between the third SAW resonator 13 and the second SAW resonator 12 and the other end grounded. This ensures the wider attenuation band than the conventional two-stage notch filter while holding the sufficient attenuation amount, reduction in size with the less component count compared with the conventional three-stage notch filter, and the effect of the reduction of the deterioration of the insertion loss in the pass band on the high frequency side.

This disclosure is preferable for a notch filter that has capability of widening an attenuation band while holding a sufficient attenuation amount and has capability of reducing an increase of a component count and reducing deterioration of an insertion loss.

In the notch filter according to the disclosure, the third frequency may be set outside a band between the first frequency and the second frequency in the attenuation band.

In the notch filter according to the disclosure, the third frequency may be set inside a band between the first frequency and the second frequency in the attenuation band.

In the notch filter according to the disclosure, a first capacitance element and a first auxiliary inductor element connected in series may be connected in parallel to the first SAW resonator, and a second capacitance element and a second auxiliary inductor element connected in series are connected in parallel to the second SAW resonator.

According to the disclosure, the notch filter is the high-pass notch filter that has the pass band on the high frequency side with respect to the attenuation band and includes the following: the input port that receives an input signal; the output port that outputs an output signal; the first SAW resonator; the second SAW resonator; the third SAW resonator; the first inductor element; and the second inductor element. The first SAW resonator is arranged between the input port and the output port and resonates in parallel at the first frequency corresponding to the attenuation band. The second SAW resonator is arranged between the input port and the output port and resonates in parallel at the second frequency corresponding to the attenuation band. The third SAW resonator is arranged with one end connected between the first SAW resonator and the second SAW resonator and the other end grounded, and resonates in parallel at the third frequency corresponding to the attenuation band. The first inductor element is arranged with one end connected between the first SAW resonator and the third SAW resonator and the other end grounded. The second inductor element is arranged with one end connected between the second SAW resonator and the third SAW resonator and the other end grounded. This ensures a wider attenuation band than the conventional two-stage notch filter while holding a sufficient attenuation amount. Further, this ensures reduction in size with the less component count than the conventional three-stage notch filter and ensures reduction of deterioration of the insertion loss in the pass band on the high frequency side.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A high-pass notch filter having a pass band on a high frequency side with respect to an attenuation band, the high-pass notch filter comprising:

an input port configured to receive an input signal;
an output port configured to output an output signal;
a first SAW resonator and a second SAW resonator arranged between the input port and the output port, the first SAW resonator being configured to resonate in parallel at a first frequency corresponding to the attenuation band, the second SAW resonator being configured to resonate in parallel at a second frequency corresponding to the attenuation band;
a third SAW resonator having one end and another end, the one end of the third SAW resonator being connected between the first SAW resonator and the second SAW resonator, and the another end of the third SAW resonator being grounded, and the third SAW resonator being configured to resonate in parallel at a third frequency corresponding to the attenuation band;
a first inductor element having one end and another end, the one end of the first inductor element being connected between the first SAW resonator and the third SAW resonator, and the another end of the first inductor element being grounded; and
a second inductor element having one end and another end, the one end of the second inductor element being connected between the second SAW resonator and the third SAW resonator, and the another end of the second inductor element being grounded.

2. The notch filter according to claim 1, wherein
the third frequency is set outside a band between the first frequency and the second frequency in the attenuation band.

3. The notch filter according to claim 1, wherein
the third frequency is set inside a band between the first frequency and the second frequency in the attenuation band.

4. The notch filter according to claim 1, further comprising:
a first capacitance element and a first auxiliary inductor element connected in series are connected in parallel to the first SAW resonator, and
a second capacitance element and a second auxiliary inductor element connected in series are connected in parallel to the second SAW resonator.

* * * * *